United States Patent [19]

Singer

[11] Patent Number: 4,485,392

[45] Date of Patent: Nov. 27, 1984

[54] LATERAL JUNCTION FIELD EFFECT TRANSISTOR DEVICE

[75] Inventor: Barry M. Singer, New York, N.Y.

[73] Assignee: North American Philips Corporation, New York, N.Y.

[21] Appl. No.: 334,997

[22] Filed: Dec. 28, 1981

[51] Int. Cl.³ .................... H01L 29/80; H01L 29/78; H01L 29/90; H01L 29/40

[52] U.S. Cl. ........................... 357/22; 357/53; 357/13; 357/23

[58] Field of Search ............... 357/22, 23 HV, 22 G, 357/53, 13, 13 PT, 13 U

[56] References Cited

U.S. PATENT DOCUMENTS

| | | | |
|---|---|---|---|
| 4,066,917 | 1/1978 | Compton et al. | 357/22 |
| 4,143,392 | 3/1979 | Mylroie | 357/22 |
| 4,185,291 | 1/1980 | Hirao et al. | 357/22 |
| 4,292,642 | 9/1981 | Appels et al. | 357/22 |
| 4,300,150 | 11/1981 | Colak | 357/23 VD |
| 4,314,267 | 2/1982 | Bergeron et al. | 357/22 |
| 4,374,389 | 2/1983 | Temple | 357/13 |
| 4,379,726 | 4/1983 | Kumamaru et al. | 357/48 |

FOREIGN PATENT DOCUMENTS

| | | | |
|---|---|---|---|
| 53-67368 | 6/1978 | Japan | 357/134 |
| 55-153378 | 11/1980 | Japan | 357/22 G |

OTHER PUBLICATIONS

IEDM "High Voltage Thin Layer Devices (Resurf Devices)" Appels et al. 1979, pp. 238–241.

Primary Examiner—Martin H. Edlow
Assistant Examiner—Jerome Jackson
Attorney, Agent, or Firm—Robert T. Mayer; Steven R. Biren

[57] ABSTRACT

A lateral junction field effect transister device includes both a surface semiconductor layer located between the gate and drain contact regions of the device and a buried semiconductor layer which extends beneath at least the drain contact region and the surface semiconductor layer of the device. The buried layer may be in the form of a continuous layer extending beneath the gate, source, and drain contact regions of the device as well as the surface semiconductor layer, or it may be provided in annular form with an aperture beneath the source and gate regions. The annular central buried layer configuration may further include an additional buried layer portion extending beneath the source region of the device. Devices having buried and surface layers in accordance with the invention feature improved high-voltage breakdown characteristics, enhanced conductivity in the "on" state, and the ability to operate in the source-follower mode.

3 Claims, 4 Drawing Figures

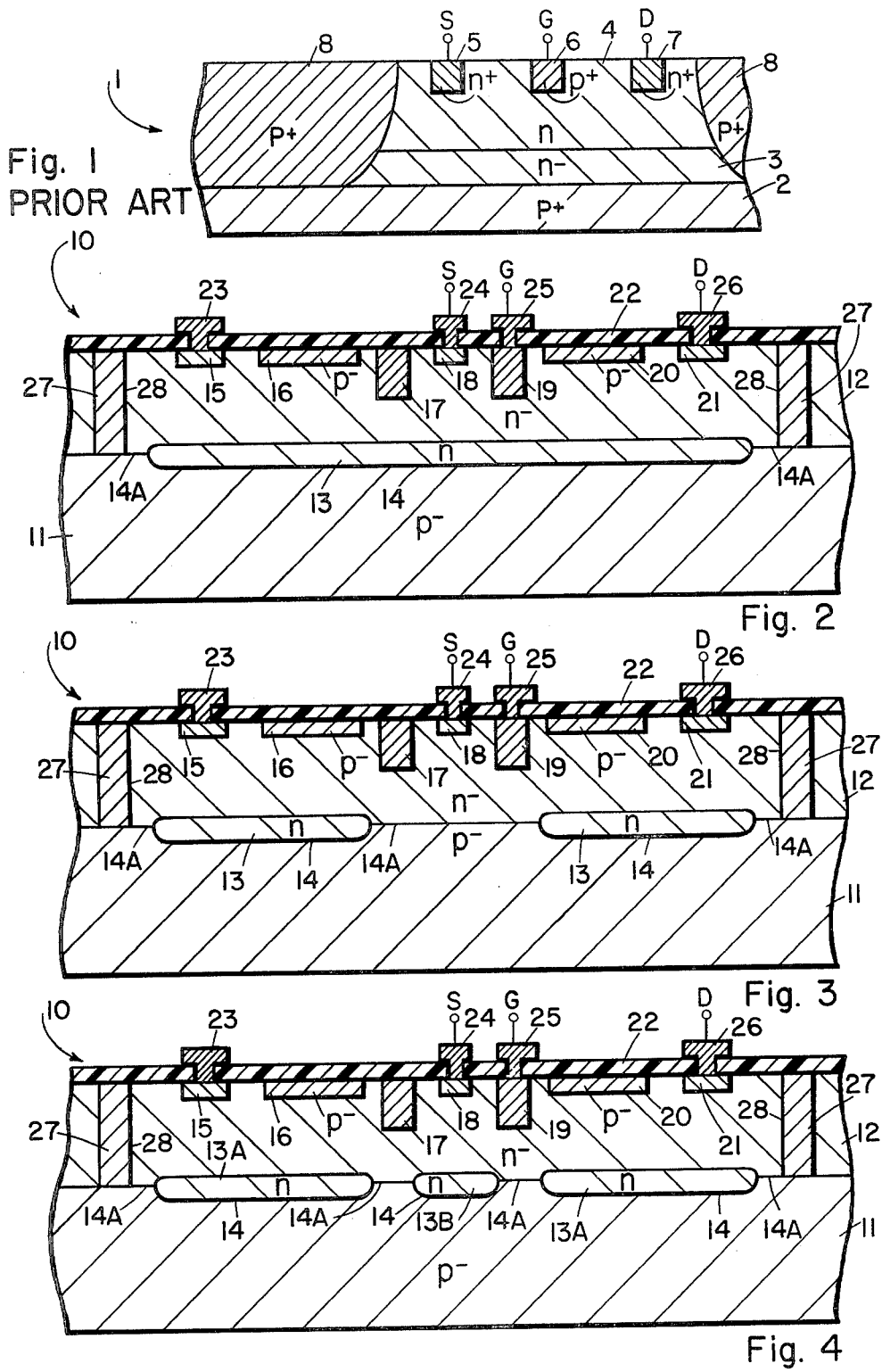

LATERAL JUNCTION FIELD EFFECT TRANSISTOR DEVICE

BACKGROUND OF THE INVENTION

The invention is in the field of field effect transistor (FET) devices, and relates specifically to lateral junction field effect transistor (JFET) devices.

Such transistors are well-known in the art, and one such device is shown in Japanese Kokai No. 55-153378. This device includes a semiconductor substrate of a first conductivity type (p-type), a first semiconductor layer of a second conductivity type (n-type), and source, gate and drain contact regions located at the surface of the first semiconductor layer, with the gate region being of the first conductivity type and located between the source and drain contact regions, which are of the second conductivity type. This device is electrically isolated from adjacent portions of the first semiconductor layer by isolation zones of the first conductivity type. Finally, this device includes a buried semiconductor layer of the second conductivity type which has a doping level less than that of the first semiconductor layer, the buried layer being located between the first layer and the substrate so as to form a p-n junction with the substrate and extend beneath the source, gate and drain contact regions of the device. This lightly-doped buried semiconductor layer has a graduated doping concentration and is included for the purpose of reducing the back gate capacitance of the device.

For high-voltage applications, it has been found that the breakdown characteristics of semiconductor devices can be improved by using the REduced SURface Field (RESURF) technique, as described in "High Voltage Thin Layer Devices (RESURF Devices)", "International Electronic Devices Meeting Technical Digest", December, 1979, pages 238-240, by Appels et al. Application of the RESURF technique to bipolar transistors, junction field effect transistors and insulated-gate field effect transistors is shown in U.S. Pat. No. 4,292,642 to Appels et al and U.S. Pat. No. 4,300,150 to Colak. In general terms, the RESURF technique used in these references serves to improve high-voltage device breakdown characteristics by reducing surface field levels through the use of modified thickness and doping characteristics in the semiconductor layers of the device.

Heretofore, junction field effect transistors have suffered from several drawbacks which have limited their utility in high-voltage applications. Specifically, prior-art high-voltage junction field effect transistors using the RESURF technique are not capable of operating effectively in the source-follower mode, due to the high gate potentials and resultant punch-through breakdown associated with this mode of operation. Furthermore, prior-art JFET devices are not normally operated with a forward gate bias in the "on" state because this would be of no advantage in conventional devices, where the injected carriers would simply diffuse into the substrate. However, the use of forward gate bias in the "on" state would be a potentially valuable technique for enhancing device conductivity in a device configuration in which such forward gate bias could effectively modulate channel resistivity.

Thus, known junction field effect transistor devices are not capable of operating in the source-follower mode and also providing relatively high breakdown voltage levels and a relatively low on-resistance.

SUMMARY OF THE INVENTION

It is therefore an object of the present invention to provide a lateral junction field effect transistor which is capable of operating at high voltages and in the source-follower mode.

It is a further object of the invention to provide a lateral junction field effect transistor for use at high voltages in which the gate region can be forward biased in the "on" state for reduced on-resistance. In accordance with the invention, these objects are achieved by a lateral junction field effect transistor device of the general type described above in which the buried semiconductor layer of the second conductivity type has a doping level greater than that of the first semiconductor layer, and in which a surface semiconductor layer of the first conductivity type is provided at the surface of the first layer and between the gate and drain contact regions of the device. The doping level of the surface layer is on the same order of magnitude as that of the substrate.

In a preferred embodiment of the invention, the buried semiconductor layer extends beneath the drain contact region and the surface layer, although this buried semiconductor layer may additionally extend beneath the gate and source regions, and the buried layer may also be made up of two buried layer portions, one portion extending beneath the drain contact region and the surface layer, while the second portion, which is spaced apart from the first, extends beneath the source region.

These features are most advantageously employed in devices using the RESURF technique, as discussed above, although conventional JFET devices may also incorporate the invention.

Each of the embodiments mentioned above is capable of operating in the source-follower mode and at high voltages, and is also capable of providing reduced on-resistance in combination with high breakdown voltage characteristics. In particular, transistors in accordance with the present invention are theoretically capable of providing a ten-times improvement in on-resistance for a constant breakdown voltage, as compared to prior-art devices using the RESURF technique but not capable of operating with the gate region foward biased in the "on" state.

BRIEF DESCRIPTION OF THE DRAWING

FIG. 1 is a cross-sectional view of a prior art lateral junction field effect transistor device;

FIG. 2 is a cross-sectional view of a lateral JFET device in accordance with a first embodiment of the invention;

FIG. 3 is a cross-sectional view of a lateral JFET device in accordance with a second embodiment of the invention; and FIG. 4 is a cross-sectional view of a laterial JFET device in accordance with a third embodiment of the invention.

DETAILED DESCRIPTION

FIG. 1 of the drawing shows a prior-art junction field effect transistor as disclosed in Japanese Kokai No. 55-153378. It should be noted that FIG. 1, as well as the remaining figures of the drawing, are not drawn to scale, and in particular the vertical dimensions are exaggerated for improved clarity. Additionally, like parts of FIGS. 2–4 are designated with like reference numerals, and semiconductor regions of the same conductivity type are generally shown hatched in the same direction.

In FIG. 1, a JFET device 1 has a semiconductor substrate 2 of the first (p) conductivity type and a relatively high (p+) doping level. A buried semiconductor layer 3 of the second (n) conductivity type is lightly doped (n−) and located on the substrate 2. A first semiconductor layer 4 of the second conductivity type has a higher doping level than that of the buried layer, is located immediately above the buried layer and contains the source region 5, gate region 6 and drain contact region 7 of the device adjacent its upper surface. Source region 5 and drain contact region 7 are of heavily-doped (n+) semiconductor material, while gate region 6 is of p+ semiconductor material. Finally, the JFET device is laterally isolated from other elements on the same substrate by p+ regions 8, which form isolating junctions with n-type layers 3 and 4. In this device, the purpose of buried layer 3, which is of graduated and higher resistivity (e.g. lower doping level) than that of its overlying layer 4, is simply to reduce the back gate capacitance of the device, and this structure is not particularly adapted for operation in the source follower mode, high voltage operation or operation with a forward-biased gate region to enhance conductivity.

An improved lateral junction field effect transistor device in accordance with the invention is shown in FIG. 2. This device includes a p− semiconductor substrate 11 which has a doping level of about $4 \times 10^{14}$ acceptors/cm$^3$. An n-first semiconductor layer 12 is located on the substrate. This first semiconductor layer may typically be an epitaxial layer having a doping concentration of about $5 \times 10^{14}$ donors/cm$^3$ and a thickness of about 6 microns. Source, gate, and drain contact regions, (18, 17/19, and 15/21, respectively) are located at the surface of the first semiconductor layer, with the gate region being of p-type material and having a doping concentration in the order of $10^{18}$ acceptors/cm$^3$, while the source and drain contact regions are of n-type material and have a doping level of about $10^{20}$ donors/cm$^3$. The device shown in FIG. 2 is symmetrical about the centrally-located source region 18, with the gate and drain contact regions forming concentric annular (in this case rectangular) regions about the source when viewed from above. Thus, the two segments of the gate region (17/19) represent a cross-section through a single annular gate region which is located between the source and drain contact regions of the device, while the drain contact region segments (15/21) similarly represent a cross-sectional view through a unitary, annular drain contact region. Since the devices shown in FIGS. 2, 3 and 4 are of the "extended drain" type, the entire drain region includes both the drain contact region 15/21 and that part of the first semiconductor layer 12 which is located adjacent to the drain contact region and extends towards the gate region 17/19. Electrical connections to the source, gate and drain contact regions are made by metallization layer portions 24, 25, and 26/23, respectively, with the connections being made through apertures in an oxide insulating layer 22. The metallization layer portions may typically be of aluminum or polysilicon, while the oxide layer may typically be a silicon oxide layer of one micron thickness.

The lateral JFET device 10 is electrically isolated from adjacent portions of the first semiconductor layer 12 by annular isolation region 27 of p-type semiconductor material. This isolation region has a doping concentration of $10^{17}$–$10^{18}$ acceptors/cm$^3$, with its p-type semiconductor material forming a vertical p-n isolation junction with the n-type first semiconductor layer 12. Alternatively, isolation region 27 may comprise a sunken oxide region to electrically insulate the device from adjacent portions of the first semiconductor layer.

In accordance with the invention, the device also includes an annular p− surface semiconductor layer 16/20 having a doping level on the same order of magnitude as that of the substrate, or about $4 \times 10^{14}$ acceptors/cm$^3$, and a thickness of about 1–2 microns. This surface layer is located at the surface of the first semiconductor layer 12 between the gate and drain contact regions. The surface semiconductor layer is shaped in the form of a continuous annular layer when viewed from above, so that layer portions 16 and 20 represent two portions of the same surface layer as seen in cross-section.

Finally, in accordance with the invention, device 10 includes an n-type buried semiconductor layer 13 which has a doping level greater than that of the first semiconductor layer (typically $10^{12}$ donors/cm$^2$ with a thickness of 1 micron). This buried layer is located between the first semiconductor layer and the substrate so as to form a lateral p-n isolation junction 14 with the substrate. At the lateral terminations of junction 14, isolation between the n-type first semiconductor layer 12 and p-type substrate 11 is provided by lateral p-n junction portions 14A located on either side of the buried layer, which extend to meet vertical p-n junction portions 28 and thus complete the electrical isolation of the device. The buried layer extends beneath the surface layer, as well as the source, gate, and drain contact regions of the device.

Two further embodiments of the invention are shown in FIGS. 3 and 4. With the exception of the configuration of buried semiconductor layer 14, these embodiments are similar to the configuration shown in FIG. 2. However, while the buried semiconductor layer 14 of FIG. 2 extends continuously beneath the gate, source and drain contact regions, as well as the surface semiconductor layer 16/20, the buried semiconductor layer 14 in FIG. 3 is formed in an annular configuration so as to extend only beneath the drain contact region and the surface layer. Beneath the source and gate regions of the device shown in FIG. 3, electrical isolation is provided by a central portion of the p-n junction 14A formed by the intersection of the first semiconductor layer and the substrate. In FIG. 4, the buried semiconductor layer comprises first and second buried layer portions 13A and 13B, with the first buried layer portion 13A corresponding to the annular configuration of layer 13 in FIG. 3, while the second buried layer portion 13B is a centrally-located portion beneath source region 18 and spaced apart from the first buried layer portion 13A.

The device configurations described above, and in particular the combined use of surface and buried semiconductor layers in accordance with the invention, result in several important operational advantages over prior art JFET devices. First, devices in accordance with the present invention (unlike prior-art RESURF devices) can be operated in the source-follower mode at high voltages. Second, these devices can be operated as switches with both positive and negative gate voltages, with the positive gate voltage serving to forward-bias the gate in order to reduce channel on-resistance during conduction. In prior devices of this type, the use of positive gate voltages during the "on" state would not serve to decrease channel resistivity. Finally, devices in accordance with the invention combine these features with improved high voltage capability through the use of a sophisticated "2-stage" RESURF technique which provides effective field control at both intermediate and high voltage levels.

In prior art field effect transistors, and in particular those using RESURF, operation in the source-follower mode has not been feasible because of the high gate potentials required. In conventional RESURF devices, these high gate potentials would cause punch-through from the gate to the relatively lightly-doped substrate. However, by locating the buried semiconductor layer of the present invention between the first semiconductor layer and the substrate, as shown by reference numeral 13 in FIGS. 2 and 3, and reference numerals 13A and 13B in FIG. 4, and providing this buried layer with a doping level greater than that of the first semiconductor layer, punch-through to the substrate is substantially prevented, and source-follower mode operation at high voltages becomes possible. Additionally, this buried layer prevents punch-through from gate to substrate as the gate is negatively biased to turn the device off in switching applications, and it also reduces the gain of the parasitic bipolar transistor formed by the gate region 17/19, the first semiconductor layer 21 and the substrate 11.

As shown in FIGS. 2, 3 and 4, this buried semiconductor layer may be provided in several different configurations. In the basic configuration of FIG. 2, a simple, continuous buried layer 13 is provided beneath the source region 18, the gate region 17/19 and the drain contact region 15/21, as well as beneath the surface semiconductor layer 16/20. However, certain additional advantages can be obtained with further refinements. Thus, in FIG. 3, the buried semiconductor layer 13 is provided in annular form, so that it extends only beneath the drain contact region 15/21 and the surface semiconductor layer 16/20. By providing this central aperture in the buried layer, beneath the source and gate regions of the device, it is possible to selectably obtain a desired gate cutoff voltage by appropriately selecting such device parameters as the thickness of first semiconductor layer 12 and the gate diffusion depth, while at the same time avoiding gate to substrate punch-through due to the surrounding presence of the buried layer.

A further refinement of this configuration is shown in FIG. 4, where the buried layer includes an annular buried layer portion 13A beneath the drain contact region and the surface semiconductor layer, as previously described, as well as a central buried layer portion 13B. This central buried layer portion is located beneath the source region and spaced apart from the annular layer portion so as to provide a gap in the buried layer beneath the gate region of the device. This configuration permits the cutoff voltage of the device to be selected, as described above, and is particularly advantageous when used in a device having an extended or wide source region to enhance operation in the injection (i.e. forward-biased gate) mode.

However, buried semiconductor layer 13, which serves to improve device performance by preventing punch-through from gate to substrate, presents a potential disadvantage in another area of device performance. As discussed above, devices in accordance with the invention use the RESURF principle in order to operate at high voltages without breakdown, with lightly-doped substrate 11 contributing to the RESURF effect. However, the use of moderately-doped buried layer 13 substantially reduces the RESURF effect of the lightly-doped substrate, particularly at intermediate drain-to-source voltages (e.g. 150–300 volts for a 400 volt maximum device) where the device would frequently be operated. In order to overcome this problem, devices in accordance with the invention are provided with the surface semiconductor layer 16/20 as shown in FIGS. 2–4 and described above. This lightly-doped layer of p-type material, located between the gate and the drain contact regions of the device, serves to provide the RESURF effect in the medium operating voltage range by reducing the surface field in first semiconductor layer 12, thus preventing breakdown. As the source-to-drain voltage of the device increases beyond this medium range, toward the maximum permissible voltage, buried semiconductor layer 13 becomes depleted, so that the RESURF action of the lightly-doped substrate is no longer prevented.

The present invention thus provides a sophisticated "2-stage" RESURF technique, in which "RESURF-ing" is provided by surface semiconductor layer 16/20 in the medium-voltage range, where buried semiconductor layer 13 blocks the "RESURFing" action of the lightly-doped substrate. Then, as the maximum operating voltage of the device is approached, the buried semiconductor layer becomes depleted and the "RESURFing" effect of the lightly-doped substrate becomes effective. Additionally, the surface layer serves to enhance device operation by collecting minority carriers when the device is switched "off", thus improving turn-off time.

In conventional JFET devices, gate voltage in the "on" state is normally zero volts. Positive voltages are not normally used on the gate for enhanced conductivity because the additional holes generated would simply diffuse into the substrate and would not decrease channel resistivity. In the present invention, however, the n-type buried layer 13 serves to trap the additional holes in the device channel and ajoining regions, rather than permit them to diffuse into the substrate as in prior-art devices. Thus, devices in accordance with the present invention can advantageously operate with a forwardbiased gate in the "on" state, with the on-resistance of the device substantially reduced because the injected carriers remain in the channel and adjacent regions of the device, rather than simply diffusing into the substrate. By forward biasing the gate region during the "on" state, these devices are capable of operating in an enhanced conductivity or injection mode. When operated in this mode, a very substantial improvement in device conductivity is obtained, with the improvement typically being a full order of magnitude over comparable prior art devices conventionally operated with zero gate voltage in the "on" state.

Thus, by providing a junction field effect transistor with both buried and surface semiconductor layers in accordance with the invention, a device having improved high-voltage breakdown characteristics, enhanced channel conductivity in the "on" state, and the capability of operating in the source-follower mode is obtained. Alternatively, the invention may be used to obtain JFET devices with characteristics comparable to those of prior art devices, but which occupy a substantially smaller area and are thus less expensive to manufacture, while still offering the capability of source-follower mode operation.

Finally, while the invention has been particularly shown and described with reference to certain preferred embodiments thereof, it will be understood by those skilled in the art that various changes in form and detail may be made without departing from the spirit and scope of the invention.

What is claimed:

1. A lateral JFET device, which comprises:

a semiconductor substrate of a first conductivity type and having a relatively light doping level;

a first semiconductor layer of a second conductivity type opposite to that of the first on said substrate and having a relatively light doping level;

source, gate, and drain contact regions located at the surface of said first semiconductor layer, the gate region being of the first conductivity type, more heavily doped than said substrate, and located between the source and the drain contact regions, which latter regions are of the second conductivity type and more heavily doped than said first layer;

means for electrically isolating the lateral JFET device from adjacent portions of said first semiconductor layer;

a surface semiconductor layer of said first conductivity type located at the surface of said first layer and between said gate and said drain contact regions, said surface layer having a doping level on the same order of magnitude as that of said substrate; and a buried semiconductor layer of said second conductivity type and having a doping level greater than that of said first semiconductor layer, said buried layer being located between said first layer and said substrate, forming a p-n isolation junction with said substrate, and extending beneath at least said drain contact region and said surface layer.

2. A lateral JFET device as claimed in claim 1, wherein said buried layer also extends beneath said gate and source regions.

3. A lateral JFET device as claimed in claim 1, wherein said buried layer comprises first and second buried layer portions, said first buried layer portion extending beneath said drain contact region and said surface layer, and said second buried layer portion extending beneath said source region and being spaced apart from said first buried layer portion.

* * * * *